United States Patent
Leong

(10) Patent No.: US 11,043,942 B2
(45) Date of Patent: Jun. 22, 2021

(54) VARIABLE DELAY CIRCUITS AND METHODS

(71) Applicant: Intel Corporation, Santa Clara, CA (US)

(72) Inventor: Chee Seng Leong, Gelugor (MY)

(73) Assignee: Intel Corporation, Santa Clara, CA (US)

( * ) Notice: Subject to any disclaimer, the term of this patent is extended or adjusted under 35 U.S.C. 154(b) by 667 days.

(21) Appl. No.: 15/836,093

(22) Filed: Dec. 8, 2017

(65) Prior Publication Data

US 2019/0123727 A1    Apr. 25, 2019

Related U.S. Application Data

(60) Provisional application No. 62/576,276, filed on Oct. 24, 2017.

(51) Int. Cl.
| | |
|---|---|
| *H03K 5/159* | (2006.01) |
| *H03K 3/03* | (2006.01) |
| *H03K 5/131* | (2014.01) |
| *H03K 5/12* | (2006.01) |
| *H03K 5/00* | (2006.01) |

(52) U.S. Cl.
CPC ........... *H03K 5/159* (2013.01); *H03K 3/0315* (2013.01); *H03K 5/12* (2013.01); *H03K 5/131* (2013.01); *H03K 3/0322* (2013.01); *H03K 2005/00019* (2013.01); *H03K 2005/00071* (2013.01)

(58) Field of Classification Search
CPC ........ H03K 3/12; H03K 5/159; H03K 3/0315; H03K 3/0322; H03K 2005/00071; H03K 2005/00019; H03K 5/12
USPC ................. 327/262, 291, 261, 264; 331/57
See application file for complete search history.

(56) References Cited

U.S. PATENT DOCUMENTS

| | | | |
|---|---|---|---|
| 5,559,476 A | 9/1996 | Zhang et al. | |
| 6,469,585 B1 | 10/2002 | Dai et al. | |
| 7,429,897 B1 | 9/2008 | Hoang et al. | |
| 7,602,260 B1 | 10/2009 | Atesoglu | |
| 2002/0033721 A1* | 3/2002 | Tachimori | H03K 3/013 327/158 |
| 2007/0200636 A1 | 8/2007 | Cheruiyot et al. | |
| 2009/0153214 A1* | 6/2009 | Takatori | H03H 11/265 327/262 |

(Continued)

OTHER PUBLICATIONS

Vincent Von Kaenel, "A High-Speed, Low-Power Clock Generator for a Microprocessor Application," IEEE Journal of Solid-State Circuits, vol. 33, No. 11, Nov. 1998, pp. 1634-1639.

(Continued)

*Primary Examiner* — Arnold M Kinkead
(74) *Attorney, Agent, or Firm* — Steven J. Cahill

(57) ABSTRACT

A variable delay circuit includes first pull-up and first pull-down current paths and second pull-up and second pull-down current paths. The variable delay circuit generates first delays in an output signal relative to an input signal in response to the first pull-up and first pull-down current paths being enabled by a first control signal. The variable delay circuit generates second delays in the output signal relative to the input signal that are different than the first delays in response to the second pull-up and second pull-down current paths being enabled by a second control signal.

20 Claims, 7 Drawing Sheets

(56) References Cited

U.S. PATENT DOCUMENTS

2010/0271140 A1    10/2010    Raghunathan et al.

OTHER PUBLICATIONS

Samuel Michael Palermo, "A Multi-Band Phase-Locked Loop Frequency Synthesizer," Texas A&M University, Aug. 1999, pp. 100-122.

* cited by examiner

VARIABLE DELAY CIRCUITS AND METHODS

CROSS REFERENCE TO RELATED APPLICATION

This application claims the benefit of U.S. Provisional Patent Application No. 62/576,276, filed Oct. 24, 2017, which is incorporated by reference herein in its entirety.

FIELD OF THE DISCLOSURE

The present disclosure relates to electronic circuits, and more particularly, to variable delay circuits and methods.

BACKGROUND

Phase-locked loops (PLLs) are used in many integrated circuits, providing periodic signals for data recovery, data transfer, and other clocking functions. PLLs often supply a clock signal to one or more frequency dividers that divide a signal from a voltage-controlled oscillator (VCO) circuit to a lower frequency clock signal for distribution around an integrated circuit or system.

DETAILED DESCRIPTION

A multi-band voltage-controlled oscillator (VCO) circuit may be used to overcome process variations or to increase the frequency tuning capability of the oscillator to achieve a wide frequency range. One way to increase the frequency tuning range of a VCO is to discretely switch in different biasing currents. Another way is to discretely adjust the capacitive or inductive loads. Despite the increased use of multi-band VCOs, these two techniques do not scale well with semiconductor fabrication processes. The switched tuning of biasing currents suffers from poor process portability from one process node to another. The switched tuning of biasing currents also has poor voltage scalability, because it needs sufficient voltage headroom for the biasing to operate optimally. Capacitive or inductive tuning normally has limited tuning range, and the capacitors or inductors often use a significant amount of integrated circuit (IC) die area.

According to some embodiments, a variable delay circuit for a voltage-controlled oscillator (VCO) circuit includes transistors that may be discretely enabled or disabled to increase or decrease the resistance of pull-up or pull-down current paths in the variable delay circuit. A VCO having delay circuits with this architecture can achieve different frequency bands in different modes of operation to cover a wide frequency range. The VCO may also have a high frequency resolution as the VCO utilizes the small parasitic capacitances of the transistors. The parasitic capacitances of the transistors may be, for example, as small as 3 times the diffusion capacitance plus the gate overlap capacitance. The VCO may have a wide tuning range and a minimal area penalty, compared to other VCO frequency tuning techniques. In addition, the variable delay circuit may be easily ported from one semiconductor fabrication process to another.

Figure 1:
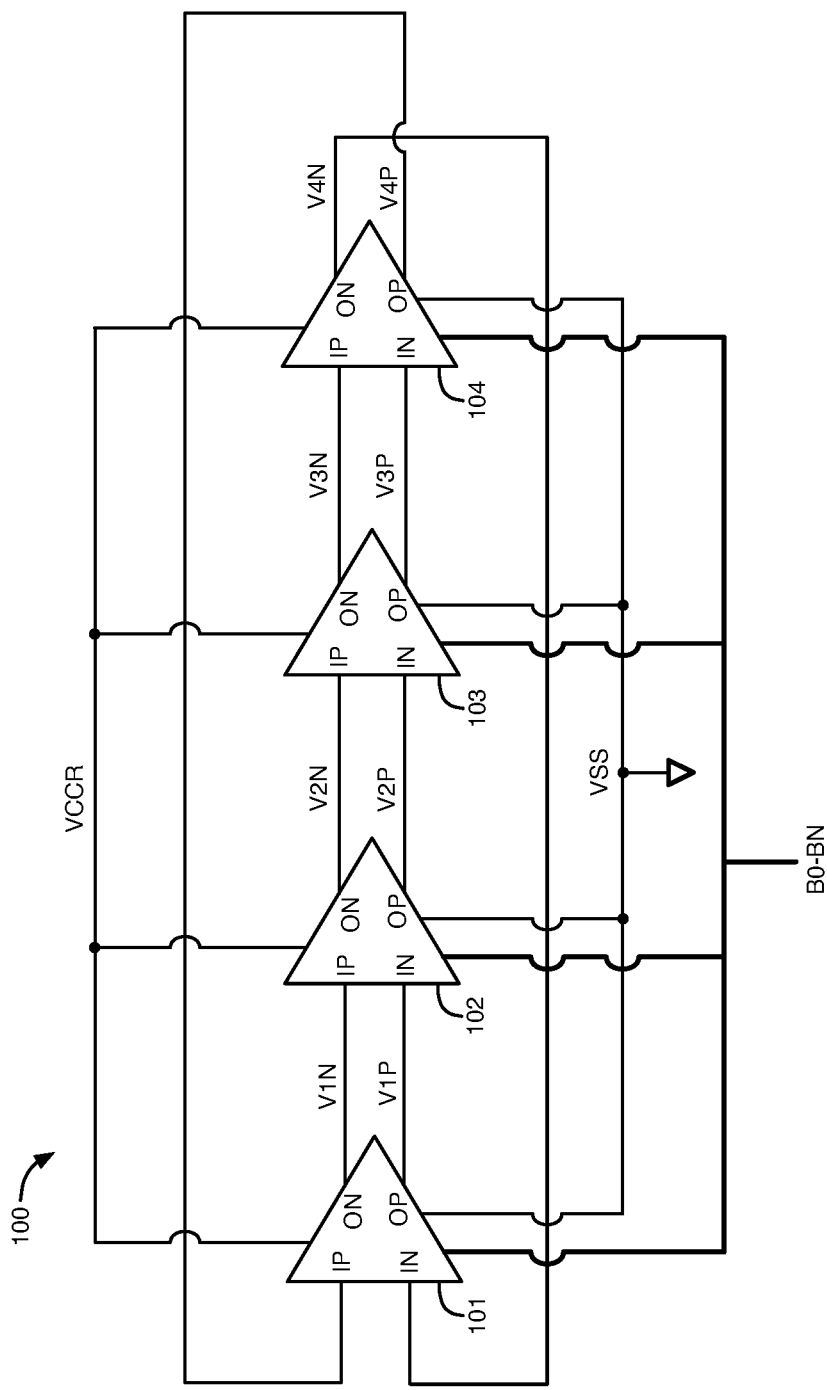
FIG. 1 illustrates an example of a voltage-controlled oscillator (VCO) circuit, according to an embodiment.

FIG. 1 illustrates an example of a voltage-controlled oscillator (VCO) circuit 100, according to an embodiment. VCO 100 may, as an example, be used in a phase-locked loop circuit. VCO circuit 100 includes four differential voltage-controlled delay stage circuits 101-104. Four differential delay stage circuits 101-104 are shown as an example, but the techniques disclosed herein can be applied to VCOs with any number of delay stage circuits. Each of the four delay stage circuits 101-104 receives differential input voltage signals at differential input terminals. Each of the delay stage circuits 101-104 delays the differential input voltage signals to generate differential output voltage signals at differential output terminals. An N number of control signals B0-BN control the delay that delay stage circuits 101-104 provide to their differential output voltage signals relative to their differential input voltage signals, and thus control signals B0-BN control the frequencies of these input and output signals.

Delay stage circuits 101-104 in VCO 100 form a ring oscillator circuit. A ring oscillator circuit generates an output signal that oscillates between high and low voltage levels. Ring oscillators that have an even number of single-ended delay circuits usually do not generate oscillating output signals, because the output voltages of the delay circuits achieve stable voltages. Therefore, ring oscillators with single-ended delay circuits are generally limited to having an odd number of delay circuits, so that they can generate oscillating output signals.

Some applications, such as some field programmable gate arrays (FPGAs), require clock signals that are separated by an even number of equally-spaced phase shifts. For example, certain serializer circuits require clock signals with 8 equally-spaced phases. However, single-ended ring oscillators generally cannot provide output signals that are separated by an even number of equally-spaced phase shifts, because they have an odd number of delay circuits.

On the other hand, VCO circuit 100 generates oscillating output voltages with an even number of equally-spaced phase shifts using an even number (4) of delay stage circuits 101-104, because delay stage circuits 101-104 are differential. Although 4 delay stage circuits are illustrated in FIG. 1, it should be understood that VCOs with the embodiments disclosed herein can have any suitable even or odd number of delay stage circuits (e.g., 3, 4, 5, 6, 7, 8, 9, etc.).

Each of the delay stage circuits 101-104 receives a supply voltage VCCR. Voltage VCCR may be, for example, a control voltage generated in a phase-locked loop (PLL) for controlling the frequencies of the oscillating output signals of VCO 100. Each of the delay stage circuits 101-104 has a positive input IP, a negative input IN, a positive output OP, and a negative output ON. As shown in FIG. 1, the positive inputs IP of delay stage circuits 102, 103, and 104 are coupled to the negative outputs ON of delay stage circuits 101, 102, and 103, respectively. The negative inputs IN of delay stage circuits 102, 103, and 104 are coupled to the positive outputs OP of delay stage circuits 101, 102, and 103, respectively. Thus, each of the inputs of delay stage circuits 102-104 is coupled to the opposite polarity output of another one of the delay stage circuits.

The positive input IP of delay stage circuit 101 is coupled to the positive output OP of delay stage circuit 104, and the negative input IN of delay stage circuit 101 is coupled to the negative output ON of delay stage circuit 104. Because the inputs of delay stage circuit 101 are coupled to the same polarity outputs of delay stage circuit 104, and the inputs of delay stage circuits 102-104 are coupled to the opposite polarity outputs of delay stage circuits 101-103, respectively, VCO circuit 100 can generate oscillating output signals.

Delay stage circuits 101, 102, 103, and 104 generate oscillating output signals V1N and V1P, V2N and V2P, V3N and V3P, and V4N and V4P, respectively, at their differential output terminals, as shown in FIG. 1. These 8 oscillating output signals are periodic clock signals. These 8 periodic clock signals may be phase shifted with respect to each other by 45°. VCO circuit 100 may be in an integrated circuit (IC), such as a programmable logic IC, a microprocessor, or a graphics processing unit.

Figure 2:
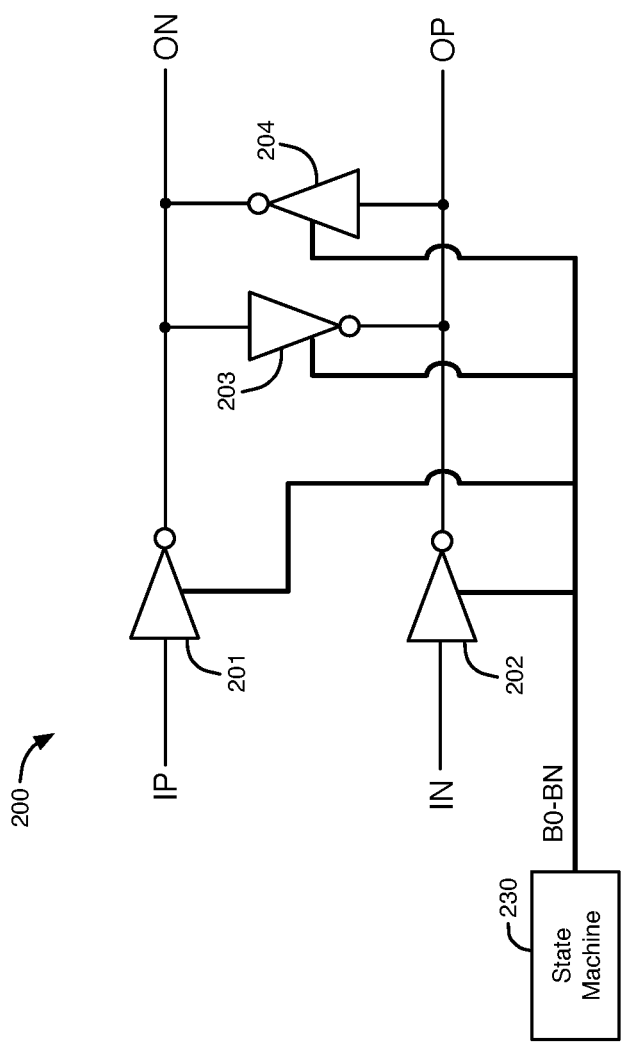
FIG. 2 illustrates an example of a delay stage circuit in a voltage-controlled oscillator (VCO) circuit, according to an embodiment.

FIG. 2 illustrates an example of a delay stage circuit 200 in a VCO, according to an embodiment. Delay stage circuit 200 is an example of each of the 4 delay stage circuits 101-104 of FIG. 1. In some embodiments, each of the delay stage circuits 101-104 includes the architecture of delay stage circuit 200. Delay stage circuit 200 includes 4 inverting variable delay circuits 201-204. The output of each of delay circuits 201-204 is indicated by a circle in FIG. 2. The input of delay circuit 201 is coupled to the positive input IP of delay stage circuit 200, and the output of delay circuit 201 is coupled to the negative output ON of delay stage circuit 200. The input of delay circuit 202 is coupled to the negative input IN of delay stage circuit 200, and the output of delay circuit 202 is coupled to the positive output OP of delay stage circuit 200. Cross-coupled delay circuits 203-204 are coupled between the outputs ON and OP of delay stage circuit 200 and between the outputs of delay circuits 201 and 202, as shown in FIG. 2. Inverting delay circuits 201-204 may be sized to meet Barkhausen stability criterion to sustain oscillation.

Control signals B0-BN are generated by a state machine circuit 230. Control signals B0-BN are provided to control inputs of each of the delay circuits 201-204. The control signals B0-BN control the variable delay that each of the delay circuits 201-204 provides to its output signal relative to its input signal. Control signals B0-BN may have any number of control signals. In the examples described below, control signals B0-BN have four control signals B0, B1, B2, and B3.

Figure 3:
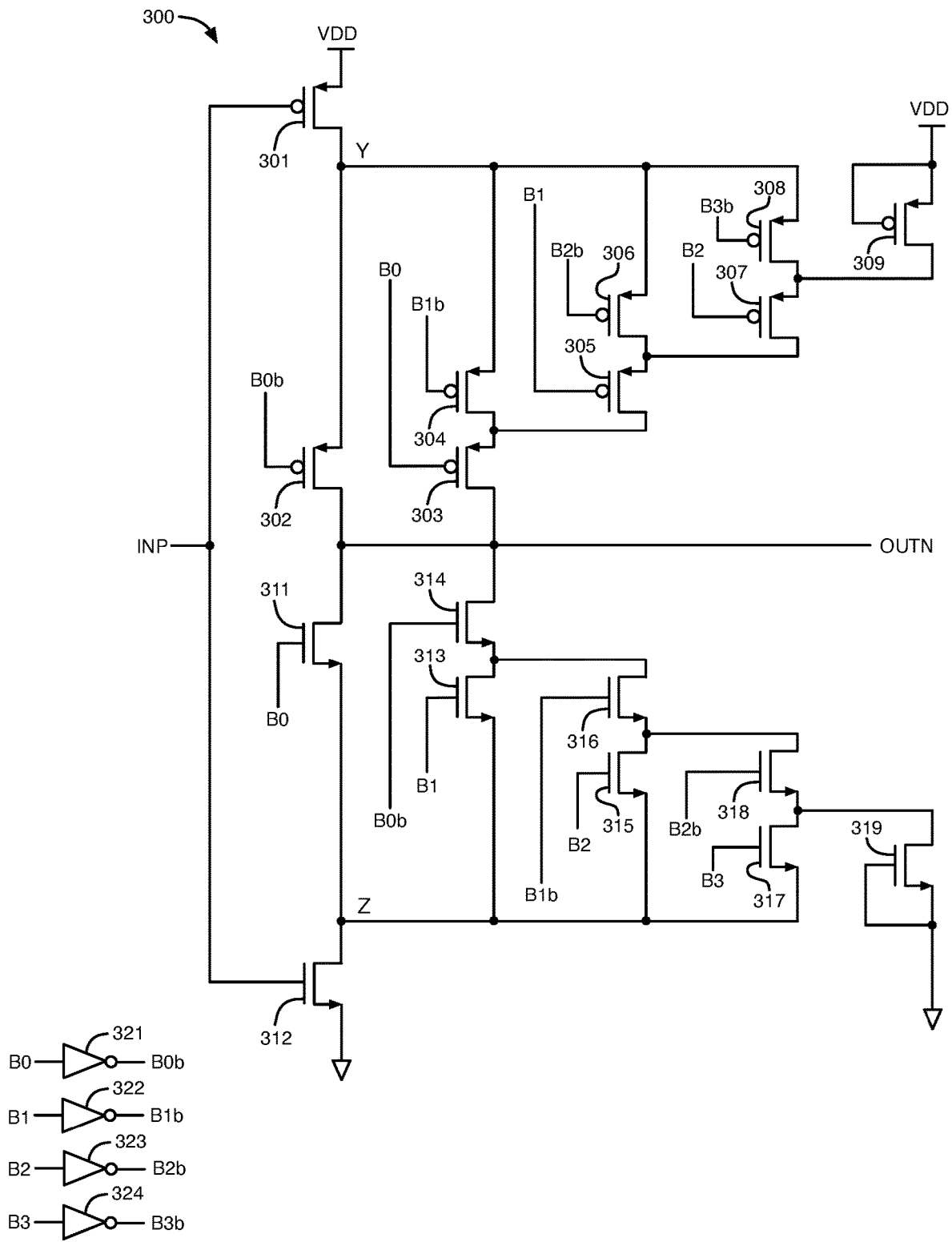
FIG. 3 illustrates an example of a variable delay circuit, according to an embodiment.

FIG. 3 illustrates an example of a variable delay circuit 300, according to an embodiment. Variable delay circuit 300 is an example of each of the 4 delay circuits 201-204 of FIG. 2. In some embodiments, VCO 100 has one or more delay circuits 300 in one or more of delay stages 101-104. In an embodiment, each of the 4 delay circuits 201-204 includes the architecture of delay circuit 300, and each of the delay stage circuits 101-104 includes the architecture of the delay stage circuit 200 that has 4 delay circuits 300. Delay circuit 300 is an inverting delay circuit (also referred to as an inverter circuit) that inverts the logic state of an input signal INP received at its input to generate an inverted logic state for the output signal OUTN generated at its output.

Delay circuit 300 includes p-channel metal oxide semiconductor field-effect transistors (MOSFETs) 301-309, n-channel MOSFETs 311-319, and 4 CMOS inverter circuits 321-324. P-channel transistors 301-309 are pull-up transistors that are used to pull the output signal OUTN to supply voltage VDD in response to input signal INP being at or near the ground voltage. N-channel transistors 311-319 are pull-down transistors that are used to pull the output signal OUTN to the ground voltage in response to the input signal INP being at or near VDD.

Transistors 301-302 and 311-312 are coupled in series between a supply terminal at supply voltage VDD and a terminal at the ground voltage. Transistors 303-304 are coupled in series between a node Y between transistors 301-302 and the output node at output voltage OUTN. Transistors 305-306 are coupled in series between node Y and the node between transistors 303-304. Transistors 307-308 are coupled in series between node Y and the node between transistors 305-306. Transistors 313-314 are coupled in series between a node Z between transistors 311-312 and the output node. Transistors 315-316 are coupled in series between node Z and the node between transistors 313-314. Transistors 317-318 are coupled in series between node Z and the node between transistors 315-316.

Inverter circuits 321-324 invert the logic states of the four control signals B0, B1, B2, and B3 to generate 4 inverted control signals B0b, B1b, B2b, and B3b, respectively. Control signals B0-B3 may be generated, for example, by state machine circuit 230. The input signal INP to delay circuit 300 is provided to the gates of transistors 301 and 312. Control signals B0b, B0, B1b, B1, B2b, B2, and B3b are provided to the gates of transistors 302-308, respectively. Control signals B0, B1, B0b, B2, B1b, B3, and B2b are provided to the gates of transistors 311 and 313-318, respectively. The gate and source of transistor 309 and the source of transistor 301 are coupled to the supply terminal at supply voltage VDD. The gate and source of transistor 319 and the source of transistor 312 are coupled to the ground terminal at the ground voltage. In an embodiment, the p-channel transistors 301-309 may have identical width-to-length (W/L) channel ratios, and the n-channel transistors 311-319 may have identical width-to-length (W/L) channel ratios.

The logic states of one or more of control signals B0-B3 can be changed to vary the delays of the delay circuits 300 (e.g., in delay circuits 201-204) in the delay stages 101-104 in VCO 100. By changing control signals B0-B3 to vary the delays of the delay circuits 300 in the delay stages of VCO 100, the frequency ranges that VCO 100 generates in its output signals V1N, V1P, V2N, V2P, V3N, V3P, V4N, and V4P (i.e., signals V1N-V4P) are varied within the frequency tuning range of VCO 100.

Table 1 below provides examples of the frequency ranges in gigahertz (GHz) that VCO 100 can provide in its output signals V1N-V4P in response to different logic states of the control signals B0-B3. In the example of Table 1, the logic states of control signals B0-B3 may be varied to generate 11 possible frequency bands 0-10 in output signals V1N-V4P. In band 0, the delay circuits 300 in VCO 100 are off, and the output signals V1N-V4P of VCO 100 do not oscillate. The delay circuits 300 in VCO 100 generate a non-zero frequency range in output signals V1N-V4P in each of the other frequency bands 1-10 shown in Table 1. The delay circuits 300 in VCO 100 can be configured by control signals B0-B3 to generate the frequency range in signals V1N-V4P for each of the frequency bands 1-10 shown in Table 1 in a different mode (i.e., a different mode of operation). Thus, during each of the 10 different modes of operation for bands 1-10, VCO 100 generates a different frequency range in signals V1N-V4P in response to a different set of logic states of control signals B0-B3, as shown in Table 1.

TABLE 1

|         | B3 | B2 | B1 | B0 | Frequency Range (GHz) |
|---------|----|----|----|----|-----------------------|
| Band 0  | 0  | 0  | 0  | 0  | 0                     |
| Band 1  | 0  | 0  | 0  | 1  | 1.5-3.7               |
| Band 2  | 0  | 0  | 1  | 1  | 1.41-3.49             |
| Band 3  | 0  | 1  | 1  | 1  | 1.32-3.27             |
| Band 4  | 1  | 1  | 1  | 1  | 1.15-2.85             |
| Band 5  | 0  | 0  | 1  | 0  | 0.95-2.425            |
| Band 6  | 0  | 1  | 1  | 0  | 0.883-2.28            |
| Band 7  | 1  | 1  | 1  | 0  | 0.817-2.14            |
| Band 8  | 0  | 1  | 0  | 0  | 0.75-2.0              |
| Band 9  | 1  | 1  | 0  | 0  | 0.675-1.65            |
| Band 10 | 1  | 0  | 0  | 0  | 0.6-1.3               |

The target frequency tuning range of VCO 100 in the example of Table 1 is 0.6 GHz to 3.7 GHz. The frequency range of each of the bands 1-10 overlaps in part with the frequency range of one or two of the adjacent bands as shown in Table 1. The frequency bands 1-10 cover the entire frequency range of 0.6 GHz-3.7 GHz with enough frequency spectrum overlap to provide a stable PLL system. The state machine 230 may step through each of the frequency bands to search for a frequency band that is closest to a target frequency. For example, if the target frequency is 2.4 GHz, band 4 is selected as the optimum frequency band. Control signals B0b, B1b, B2b, and B3b have the inverse logic states of control signals B0, B1, B2, and B3, respectively.

Figure 4:
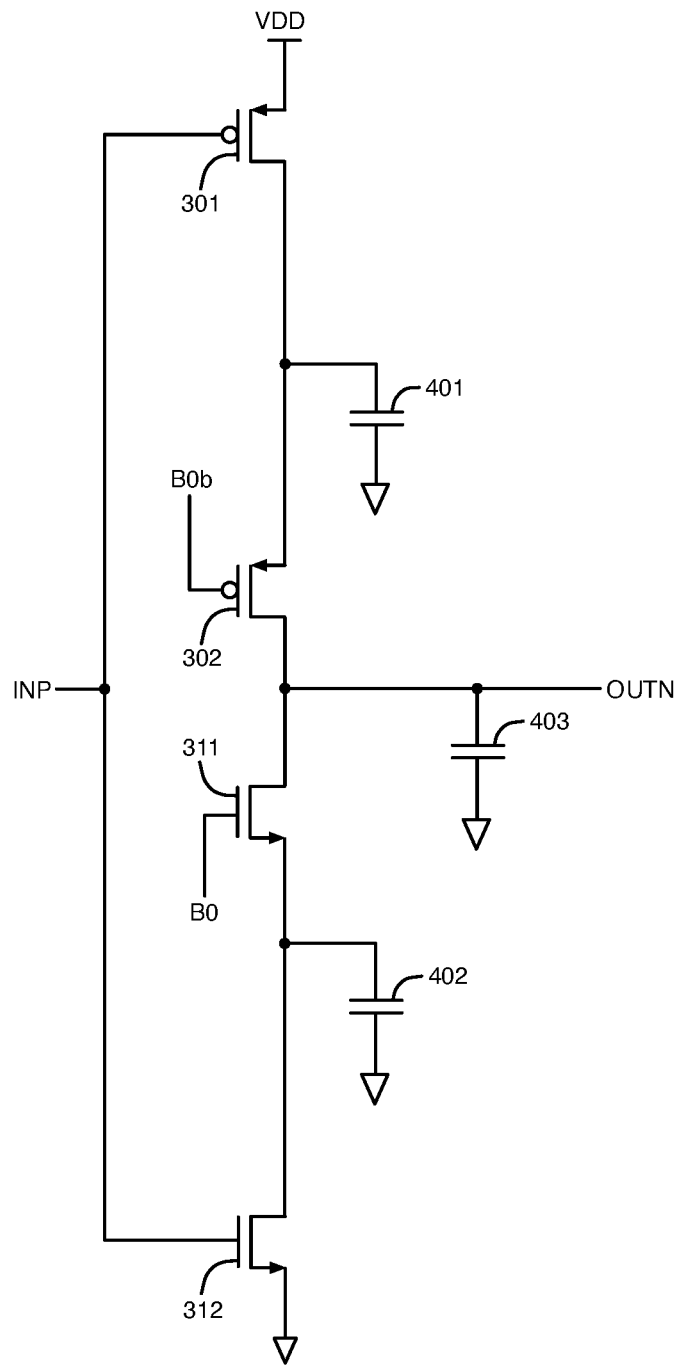
FIG. 4 illustrates an equivalent circuit for the variable delay circuit of FIG. 3 for band 1 shown in Table 1, according to an embodiment.

FIG. 4 illustrates an equivalent circuit for delay circuit 300 for band 1 shown in Table 1, according to an embodiment. In the embodiment of FIG. 4, control signals B3, B2, B1, and B0 are set to logic states of 0, 0, 0, and 1, respectively, for band 1, as shown in Table 1 during a first mode. Setting all of the delay circuits 300 in VCO 100 to band 1 generates the highest frequency range for the output signals V1N-V4P of VCO 100. In response to control signals B0-B3 being set to 1000, respectively, for band 1, transistors 302, 305, 307, 311, 316, and 318 are enabled, and the remaining transistors 303-304, 306, 308, 313-315, and 317 are disabled. When INP is low in band 1, current flows from supply voltage VDD through transistors 301-302 in the pull-up path to the output to pull OUTN to VDD. When INP is high in band 1, current flows from the output through transistors 311-312 in the pull-down path to pull OUTN to ground.

The circuit shown in FIG. 4 is a simplified circuit that can be used to estimate propagation delay. The parasitic capacitance at each node is charged up by the conducting current when pull-up transistor 301 is turned on. The total capacitance Ctu in the pull-up current path is Ctu=CP+CL. CP is the effective parasitic capacitance of the pull-up path. Although transistors 305, 307, 316, and 318 are enabled in band 1, transistors 305, 307, 316, and 318 are coupled to other transistors that are off, and as a result, the parasitic capacitances of transistors 305, 307, 316, and 318 can be ignored.

CP is represented by capacitor 401 in FIG. 4. For band 1, CP=Cgs2+Cdb1+Csb2+Cgso1+Cgso2+Csb4+Csb6+Csb8+Cgso4+Cgso6+Cgso8. The gate to source capacitance of transistor 302 is Cgs2, the drain to bulk capacitance of transistor 301 is Cdb1, the source to bulk capacitance of transistor 302 is Csb2, the gate overlap capacitance of transistor 301 is Cgso1, the gate overlap capacitance of transistor 302 is Cgso2, the source to bulk capacitance of transistor 304 is Csb4, the source to bulk capacitance of transistor 306 is Csb6, the source to bulk capacitance of transistor 308 is Csb8, the gate overlap capacitance of transistor 304 is Cgso4, the gate overlap capacitance of transistor 306 is Cgso6, and the gate overlap capacitance of transistor 308 is Cgso8. The gate overlap capacitance Cgso is a parasitic capacitance caused by a portion of the gate that overlaps the source or drain region. The parasitic capacitances from the pull-down path may be ignored to simplify the calculation for the total pull-up capacitance Ctu.

CL is the load capacitance. CL is represented by capacitor 403 in FIG. 4. For band 1, CL=CGp+CGn+Cgso2+Cgso7+Cdb2+Cdb7. Cgso7 is the gate overlap capacitance of transistor 307. Cdb2 is the drain to bulk capacitance of transistor 302. Cdb7 is the drain to bulk capacitance of transistor 307. To simplify the calculations, CGp and CGn may be assumed to be about equal to the gate oxide capacitance Coxt of each p-channel transistor and each n-channel transistor, respectively, in delay circuit 300. The parasitic gate to source capacitance Cgs may only be about ⅔ of gate oxide capacitance Coxt, because the channel is pinched off at the drain side, and the overlap capacitance Cgso is included. The drain to bulk capacitance Cdb or source to bulk capacitance Csb may be approximately equal to Cgs. Cgso is typically a fraction (e.g., ⅕) of Cgs.

Therefore, CP=6Coxt+⅕(5Coxt), and CL=4Coxt+⅕(2Coxt) for band 1. The total capacitance in the pull-up path for band 1 is Ctu=CP+CL=10Coxt+(7/5)Coxt=(57/5) Coxt. Coxt is the oxide capacitance of the transistors.

Because transistors 301 and 302 are coupled in series in the pull-up path in band 1, transistors 301-302 can be treated as one device having an effective beta βpeff=βp/2. Beta β contains the oxide capacitance Coxt of a transistor, the mobility μ of the carriers in the transistor, and the dimensions of width W and length L of the channel of the transistor. β=μCox(W/L). This factor β indicates what speed in centimeters per second (cm/s) an electron/hole carrier can develop, subject to an electric field in volts per centimeter (V/cm). When the input signal INP is applied to delay circuit 300, the current IDP through transistors 301-302 is given by equation (1) below, ignoring channel modulation. In equations (1)-(3), $V_{SG}$ is the source to gate voltage of the transistor, $V_{TP}$ is the threshold voltage of the transistor, $V_{DS}$ is the drain to source voltage of the transistor, and $tp_{LH}$ is the low-to-high propagation delay.

$$IDP = \beta peff/2 \times [V_{SG} - V_{TP}]^2 = \frac{Ctu \times dV_{DS}}{dt} \quad (1)$$

$$\int_{t1}^{t2} dt = \int_{0}^{0.5VDD} \frac{2Ctu \times dV_{DS}}{\beta_{peff}[V_{SG} - V_{TP}]^2} \quad (2)$$

$$tp_{LH} = \frac{Ctu \times VDD}{\beta_{peff}[0.5VDD - V_{TP}]^2} = \frac{Ctu \times VDD}{\beta_{peff} A^2} \quad (3)$$

In equation (3), $A=(0.5 \times VDD)-V_{TP}$. Substituting Ctu and βpeff in equation (3) yields equation (4) below for the low-to-high propagation delay $tp_{LH}$, where $$K = \frac{Coxt \times VDD}{\beta_p A^2}.$$

$$tp_{LH} = \frac{(57/5)Coxt \times VDD}{[\beta_p/2]A^2} = 22.8 \times K \quad (4)$$

The total capacitance in the pull-down current path through transistors 311-312 when transistors 311 and 312 are on in band 1 can be determined by adding together the load capacitance CL and the parasitic capacitances CN of the n-channel transistors 311-318 that affect the pull-down current path. The parasitic capacitances CN of the n-channel transistors 311-318 that affect the pull-down current path when transistors 311 and 312 are on in band 1 are represented by capacitor 402 in FIG. 4. The calculation for the high-to-low propagation delay for output voltage OUTN through the pull-down current path for band 1 generates the same result as the calculation for the low-to-high propagation delay through the pull-up current path shown above, because the pull-up and pull-down current paths are symmetrical. For optimal duty cycle performance, the transistors in the pull-up current path and the transistors in the pull-down current path may be sized to have equal current drive strength, so that the rise and fall times of voltage OUTN are the same or about the same.

Figure 5:
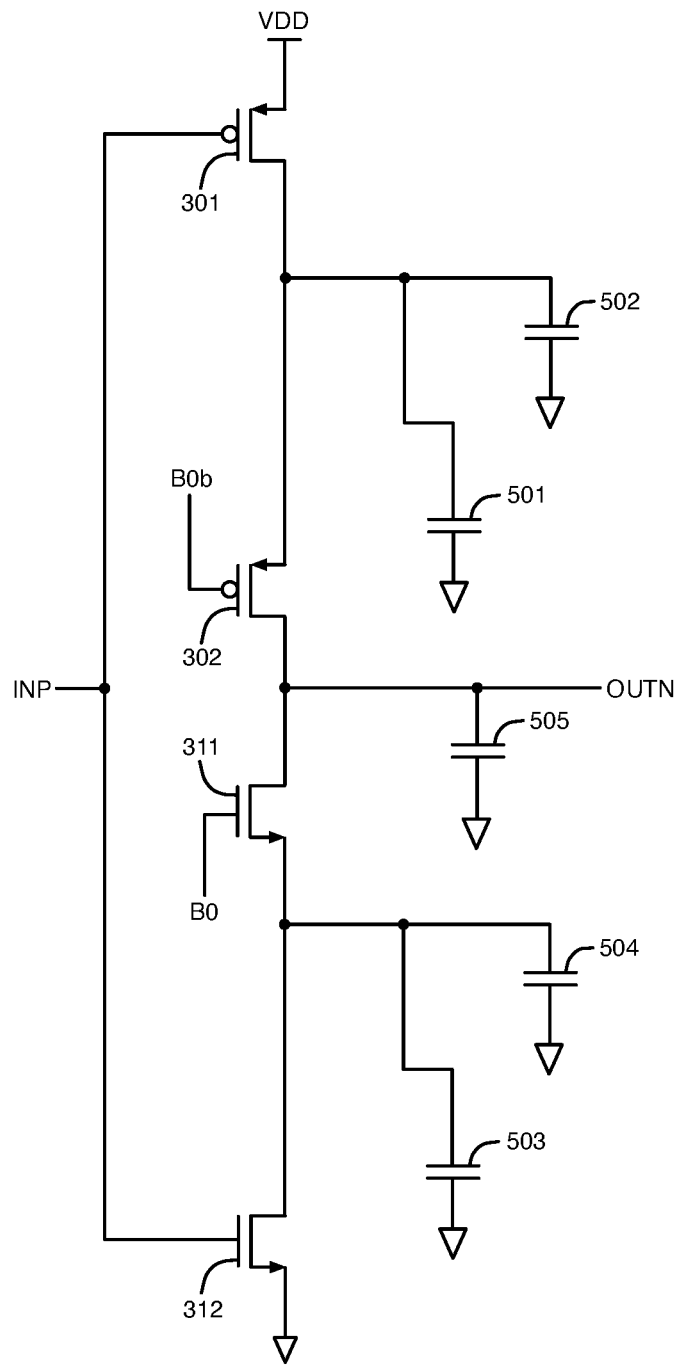
FIG. 5 illustrates an equivalent circuit for the variable delay circuit of FIG. 3 for band 2 shown in Table 1, according to an embodiment.

FIG. 5 illustrates an equivalent circuit for delay circuit 300 for band 2 shown in Table 1, according to an embodiment. In the embodiment of FIG. 5, control signals B3, B2, B1, and B0 are set to logic states of 0, 0, 1, and 1, respectively, for band 2, as shown in Table 1 during a second mode. Setting all of the delay circuits 300 in VCO 100 to band 2 generates the second highest frequency range for the output signals V1N-V4P of VCO 100. In response to control signals B0-B3 being set to 1100, respectively, for band 2, transistors 301-302, 304, 307, 311-313, and 318 are enabled, and the remaining transistors 303, 305, 306, 308, and 314-317 are disabled. When INP is low in band 2, current flows from supply voltage VDD through transistors 301-302 in the pull-up path to the output to pull OUTN to VDD. When INP is high in band 2, current flows from the output through transistors 311-312 in the pull-down path to pull OUTN to ground. Enabling transistors 304 and 313 adds more parasitic capacitance to the pull-up and pull-down paths, increasing the delay of delay circuit 300, because transistor 304 is coupled to transistors 301-302, and transistor 313 is coupled to transistors 311-312.

The circuit shown in FIG. 5 is a simplified equivalent circuit that can be used to estimate propagation delay. The parasitic capacitance at each node is charged up by the conducting current when pull-up transistor 301 is turned on. The total capacitance Ctu in the pull-up current path is Ctu=CP+CL. CP is the effective parasitic capacitance of the pull-up path. For band 2, the parasitic capacitance CP=Cgs2+Cgs4+Cdb1+Csb2+Cgso1+Cgso2+Csb4+Csb6+Csb8+Cgso4+Cgso6+Cgso8+Cdb4+Cdb5+Csb3+Cgso4+Cgso5+Cgso3. The first 12 parasitic capacitances in this equation are represented by capacitor 502 in FIG. 5, and the remaining 6 parasitic capacitances in this equation are represented by capacitor 501 in FIG. 5. Cgso4 is in the calculation for CP twice for band 2 to include the gate overlap capacitance caused by the gate overlapping the source and the drain in transistor 304, because both the gate to drain overlap capacitance and the gate to source overlap capacitance of transistor 304 affect the pull-up path in band 2. Cgs4 is the gate to source capacitance of transistor 304. Cdb4 is the drain to bulk capacitance of transistor 304. Cdb5 is the drain to bulk capacitance of transistor 305. Csb3 is the source to bulk capacitance of transistor 303. Cgso5 is the gate overlap capacitance of transistor 305. Cgso3 is the gate overlap capacitance of transistor 303. The total capacitance of the pull-up path is Ctu=CP+CL=14Coxt+(10/5)Coxt=(80/5)Coxt for band 2. CL is determined as described above with respect to FIG. 4. CL is represented by capacitor 505 in FIG. 5. Substituting Ctu in equation (3), the low-to-high propagation delay $tp_{LH}$ is given by equation (5) below for band 2.

$$tp_{LH} = \frac{Ctu \times VDD}{\beta_{peff} A^2} = \frac{(80/5)Coxt \times VDD}{[\beta_p/2]A^2} = 32 \times K \quad (5)$$

The total capacitance in the pull-down current path through transistors 311-312 when transistors 311 and 312 are on in band 2 can be determined by adding together the load capacitance CL and the parasitic capacitances CN of the n-channel transistors 311-318 that affect the pull-down current path. The parasitic capacitances CN of the n-channel transistors 311-318 that affect the pull-down current path when transistors 311 and 312 are on in band 2 are represented by capacitors 503-504 in FIG. 5. The calculation for the high-to-low propagation delay for output voltage OUTN through the pull-down current path in band 2 generates the same result as the calculation for the low-to-high propagation delay through the pull-up current path shown above, because the pull-up and pull-down current paths are symmetrical.

The concepts disclosed above apply to bands 3 and 4 shown in Table 1 during third and fourth modes, respectively. In band 3, control signals B3, B2, B1, and B0 are 0111, respectively. In band 4, control signals B3, B2, B1 and B0 are 1111, respectively, as shown in Table 1. The step between each adjacent band shown in Table 1 introduces a linear increment of 9.2×K in the $tp_{LH}$ calculation, yielding $tp_{LH}$=41.2×K and $tp_{LH}$=50.4×K for bands 3 and 4, respectively.

Figure 6:
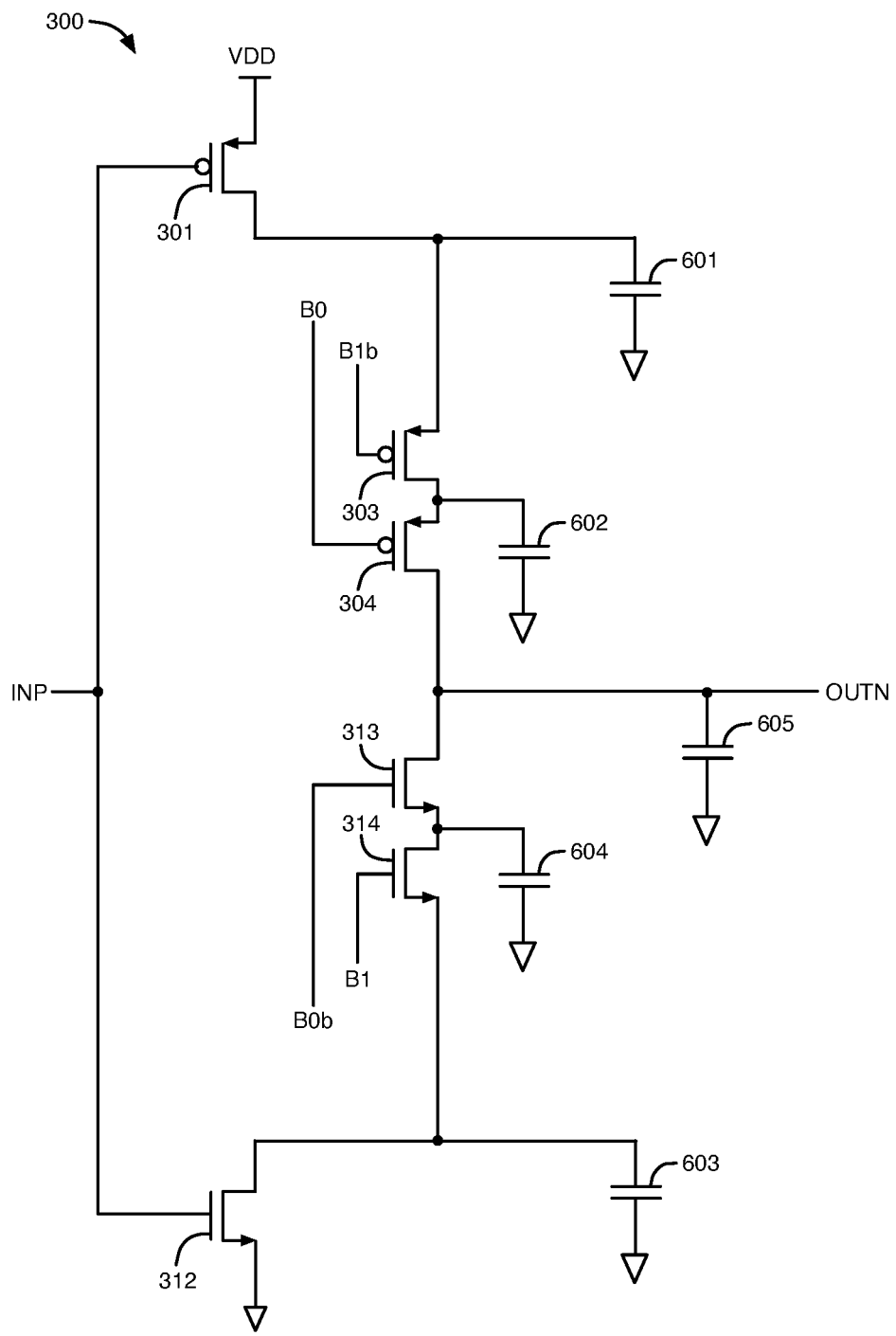
FIG. 6 illustrates an equivalent circuit for the variable delay circuit of FIG. 3 for band 5 shown in Table 1, according to an embodiment.

FIG. 6 illustrates an equivalent circuit for delay circuit 300 for band 5 shown in Table 1, according to an embodiment. In the embodiment of FIG. 6, control signals B3, B2, B1, and B0 are set to logic states of 0, 0, 1, and 0, respectively, for band 5, as shown in Table 1, during a fifth mode. In band 5, transistors 303, 304, 307, 313, 314, and 318 are enabled while the rest of the transistors 302, 311, 305-306, 308, and 315-317 are disabled. As a result, current flows from supply voltage VDD through transistors 301 and 303-304 in the pull-up path to the output to pull OUTN to VDD when INP is low. When INP is high, current flows from the output through transistors 312-314 in the pull-down path to pull OUTN to ground in band 5.

In the embodiment of FIG. 6, transistors 301, 303, and 304 can be treated as 1 long channel device with an effective βpeff=βp/3. The parasitic capacitance at each node is charged up by the conducting current when pull-up transistors 301 and 303-304 are on. The total capacitance Ctu in the pull-up current path is Ctu=CP+CL. The load capacitance CL is represented by capacitor 605 in FIG. 6. CP is the effective parasitic capacitance of the pull-up path. For band 5, the parasitic capacitance CP=Cgs4+Cgs3+Cdb1+Csb2+Cgso1+Cgso2+Csb4+Csb6+Csb8+Cgso4+Cgso6+Cgso8+Cdb4+Cdb5+Csb3+Cgso4+Cgso5+Cgso3. The first 12 parasitic capacitances in this equation are represented by capacitor 601 in FIG. 6, and the remaining 6 parasitic capacitances in this equation are represented by capacitor 602 in FIG. 6. Cgs3 is the gate to source capacitance of transistor 303. The total capacitance of the pull-up path for band 5 is Ctu=CP+CL=14Coxt+(10/5)Coxt=(80/5)Coxt. Applying Ctu and βpeff in equation (3), the low-to-high propagation delay $tp_{LH}$ is given by equation (6) below for band 5.

$$tp_{LH} = \frac{Ctu \times VDD}{\beta_{peff} A^2} = \frac{(80/5)Coxt \times VDD}{[\beta_p/3]A^2} = 48 \times K \quad (6)$$

The total capacitance in the pull-down current path through transistors 312-314 when transistors 312-314 are on in band 5 can be determined by adding together the load capacitance CL and the parasitic capacitances CN of the n-channel transistors 311-318 that affect the pull-down current path. The parasitic capacitances CN of the n-channel transistors 311-318 that affect the pull-down current path when transistors 312-314 are on in band 5 are represented by capacitors 603-604 in FIG. 6. The calculation for the high-to-low propagation delay for output voltage OUTN through the pull-down current path in band 5 generates the same result as the calculation for the low-to-high propagation delay through the pull-up current path shown above, because the pull-up and pull-down current paths are symmetrical.

In band 6, the control signals B3, B2, B1, and B0 are set to 0110, respectively, as shown in Table 1, during a sixth mode. In band 6, transistors 303-304, 306, and 313-315 are enabled, and transistors 302, 305, 307-308, 311, and 316-318 are disabled. As a result, current flows from supply voltage VDD through transistors 301 and 303-304 in the pull-up path to the output to pull OUTN to VDD when INP is low in band 6. When INP is high in band 6, current flows from the output through transistors 312-314 in the pull-down path to pull OUTN to ground. Each transistor 306 and 315 introduces an additional parasitic capacitance into the pull-up path and the pull-down path, respectively, of 3Coxt+3Cgso. As a result, the low-to-high propagation delay $tp_{LH}$ for band 6 is given by equation (7) below.

$$tp_{LH} = \frac{Ctu \times VDD}{\beta_{peff} A^2} = \frac{(103/5)Coxt \times VDD}{[\beta_p/3]A^2} = 61.8 \times K \quad (7)$$

In band 7, the control signals B3, B2, B1, and B0 are set to 1110, respectively, as shown in Table 1, during a seventh mode. In band 7, transistors 303, 304, 306, 308, 313-315, and 317 are enabled, and transistors 302, 305, 307, 311, 316, and 318 are disabled. As a result, current flows from supply voltage VDD through transistors 301 and 303-304 in the pull-up path to the output to pull OUTN to VDD when INP is low in band 7. When INP is high in band 7, current flows from the output through transistors 312-314 in the pull-down path to pull OUTN to ground. Each transistor 308 and 317 introduces an additional parasitic capacitance into the pull-up path and the pull-down path, respectively, of 3Coxt+3Cgso. As a result, the low-to-high propagation delay $tp_{LH}$ for band 7 is given by equation (8) below.

$$tp_{LH} = \frac{Ctu \times VDD}{\beta_{peff} A^2} = \frac{(136/5)Coxt \times VDD}{[\beta_p/3]A^2} = 75.6 \times K \quad (8)$$

In band 8, the control signals B3, B2, B1, and B0 are set to 0100, respectively, as shown in Table 1, during an eighth mode. In band 8, transistors 303, 305-306, and 314-316 are enabled, and transistors 302, 304, 307-308, 311, 313, and 317-318 are disabled. In band 9, the control signals B3, B2, B1, and B0 are set to 1100, respectively, as shown in Table 1, during a ninth mode. In band 9, transistors 303, 305-306, 308, and 314-317 are enabled, and transistors 302, 304, 307, 311, 313, and 318 are disabled. When INP is low in bands 8 and 9, current flows from supply voltage VDD through transistors 301, 306, 305, and 303 in the pull-up path to the output to pull output voltage OUTN to VDD. When INP is high in bands 8 and 9, current flows from the output through transistors 314, 316, 315, and 312 in the pull-down path to pull the output voltage OUTN to ground.

In band 10, the control signals B3, B2, B1, and B0 are set to 1000, respectively, as shown in Table 1, during a tenth mode. In band 10, transistors 303, 305, 307-308, 314, and 316-318 are enabled, and transistors 302, 304, 306, 311, 313, and 315 are disabled. When INP is low in band 10, current flows from VDD through transistors 301, 308, 307, 305, and 303 in the pull-up path to the output to pull output voltage OUTN to VDD. When INP is high in band 10, current flows from the output through transistors 314, 316, 318, 317, and 312 in the pull-down path to pull the output voltage OUTN to ground.

Table 2 below shows examples of the low-to-high propagation delays and the high-to-low propagation delays of variable delay circuit 300 for the frequency bands 1-10 of Table 1. The delays shown in Table 2 are in seconds. The low-to-high and high-to-low delays in output signal OUTN relative to input signal INP increase from band 1 to band 10 as shown in Table 2, where K is defined above with respect to equation (4).

TABLE 2

| | B3 | B2 | B1 | B0 | Low-to-High Delay | High-to-Low Delay | Frequency Overlap (%) |
|---|---|---|---|---|---|---|---|
| Band 1 | 0 | 0 | 0 | 1 | 22.8K | 22.8K | |
| Band 2 | 0 | 0 | 1 | 1 | 32K | 32K | 71.25 |
| Band 3 | 0 | 1 | 1 | 1 | 41.2K | 41.2K | 77.67 |
| Band 4 | 1 | 1 | 1 | 1 | 50.4K | 50.4K | 81.75 |
| Band 5 | 0 | 0 | 1 | 0 | 48K | 48K | NA |
| Band 6 | 0 | 1 | 1 | 0 | 61.8K | 61.8K | 81.55 |
| Band 7 | 1 | 1 | 1 | 0 | 75.6K | 75.6K | 84.21 |
| Band 8 | 0 | 1 | 0 | 0 | 82.4K | 82.4K | 91.75 |
| Band 9 | 1 | 1 | 0 | 0 | 100.8K | 100.8K | 81.75 |
| Band 10 | 1 | 0 | 0 | 0 | 126K | 126K | 80.00 |

The delay increments between adjacent bands in Table 2 are not linear, but instead the delay increments increase monotonically. The frequency bands 1-10 have a significant frequency overlap between adjacent frequency bands as shown in Table 2. Although for band 5, the frequency overlap can be ignored to avoid non-monotonic behavior, as shown by not applicable (NA) in Table 2.

The circuitry of FIG. 3 can provide significant frequency overlap between the adjacent frequency bands 1-10 so that the calibrated frequency is close to the middle of the frequency range. As an example, a target may be to have at least 30% frequency overlap between any frequency band and the next higher frequency band. From Table 2, the minimum frequency overlap between two adjacent bands (bands 1 and 2) is more than 71%. This larger frequency overlap may improve the resolution of frequency calibration. The larger frequency overlap may also reduce the calibration residual error to allow a larger frequency tuning range for a phase-locked loop circuit having VCO 100 with delay circuits 300 in order to compensate for voltage and temperature drift.

Figure 7:
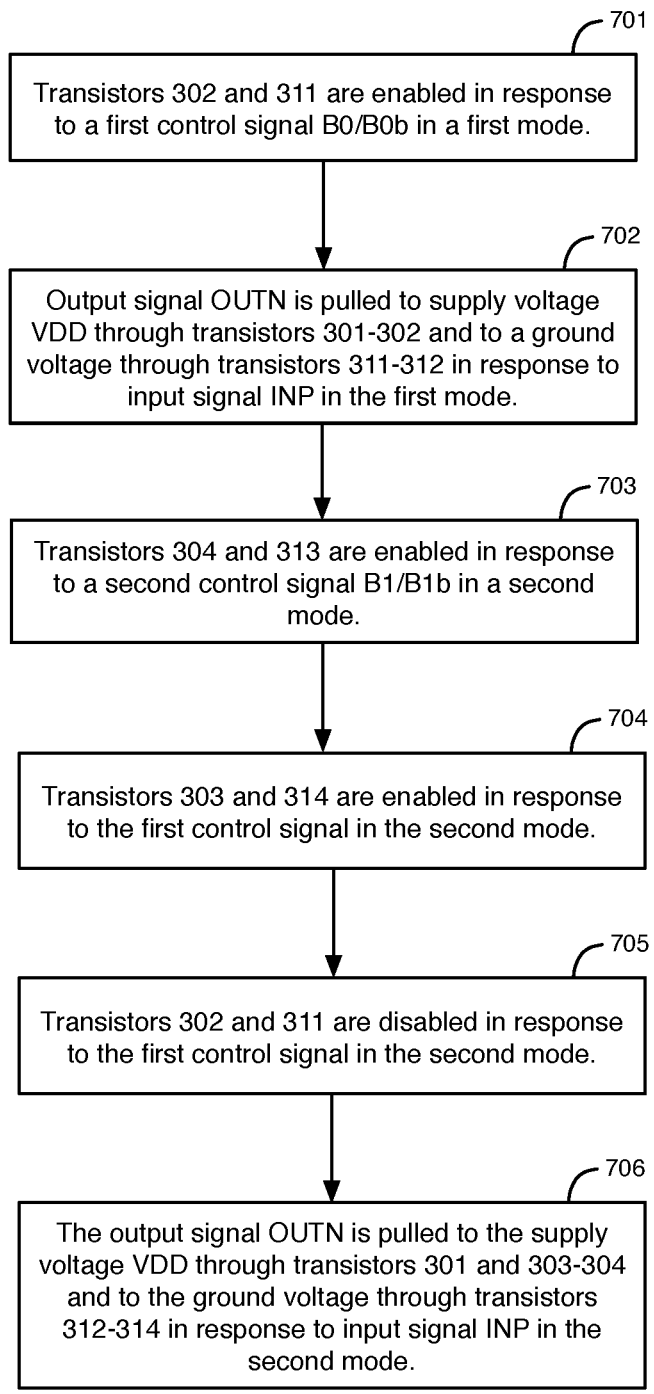
FIG. 7 is a flow chart that illustrates examples of operations for varying a delay of a signal using a variable delay circuit, according to an embodiment.

FIG. 7 is a flow chart that illustrates examples of operations for varying a delay of a signal using variable delay circuit 300, according to an embodiment. In operation 701, transistors 302 and 311 are enabled in response to a first control signal B0/B0b in a first mode. The first mode may, for example, correspond to frequency band 1 or 2. In operation 702, output signal OUTN is pulled to supply voltage VDD through transistors 301-302 and to a ground voltage through transistors 311-312 in response to input signal INP in the first mode. In operation 703, transistors 304 and 313 are enabled in response to a second control signal B1/B1b in a second mode. The second mode may, for example, correspond to frequency band 5. In operation 704, transistors 303 and 314 are enabled in response to the first control signal in the second mode. In operation 705, transistors 302 and 311 are disabled in response to the first control signal in the second mode. In operation 706, the output signal OUTN is pulled to the supply voltage VDD through transistors 301 and 303-304 and to the ground voltage through transistors 312-314 in response to input signal INP in the second mode.

The embodiments disclosed herein may be incorporated into any suitable integrated circuit. For example, the embodiments may be incorporated into numerous types of devices such as programmable logic integrated circuits, application specific standard products (ASSPs), and application specific integrated circuits (ASICs). Examples of programmable logic integrated circuits include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The integrated circuits described in one or more embodiments herein may be part of a data processing system that includes one or more of the following components: a processor; memory; input/output circuitry; and peripheral devices. The data processing can be used in a wide variety of applications, such as computer networking, data networking, instrumentation, video processing, digital signal processing, or any suitable other application where the advantage of using programmable or re-programmable logic is desirable. The integrated circuits can be used to perform a variety of different logic functions. For example, a programmable logic integrated circuit can be configured as a processor or controller that works in cooperation with a system processor. A programmable logic integrated circuit may also be used as an arbiter for arbitrating access to a shared resource in the data processing system. In yet another example, a programmable logic integrated circuit can be configured as an interface between a processor and one of the other components in the system.

The following examples pertain to further embodiments. Example 1 is a variable delay circuit comprising: first, second, third, and fourth transistors coupled in series between a supply terminal and a ground terminal, wherein control inputs of the first and fourth transistors are coupled to an input of the variable delay circuit, and wherein the second and third transistors are coupled to an output of the variable delay circuit; fifth and sixth transistors coupled in series, wherein the fifth transistor is coupled between the first and second transistors, and wherein the sixth transistor is coupled to the output; and seventh and eighth transistors coupled in series, wherein the seventh transistor is coupled between the third and fourth transistors, wherein the eighth transistor is coupled to the output, wherein the second, third, sixth, and eighth transistors are responsive to a first control signal, and wherein the fifth and seventh transistors are responsive to a second control signal.

In Example 2, the subject matter of Example 1 can optionally further include ninth and tenth transistors coupled in series, wherein the ninth transistor is coupled between the first and second transistors, wherein the tenth transistor is coupled between the fifth and sixth transistors, wherein the ninth transistor is responsive to a third control signal, and wherein the tenth transistor is responsive to the second control signal.

In Example 3, the subject matter of Example 2 can optionally further include eleventh and twelfth transistors coupled in series, wherein the eleventh transistor is coupled between the third and fourth transistors, wherein the twelfth transistor is coupled between the seventh and eighth transistors, wherein the eleventh transistor is responsive to the third control signal, and wherein the twelfth transistor is responsive to the second control signal.

In Example 4, the subject matter of Example 3 can optionally further include thirteenth and fourteenth transistors coupled in series, wherein the thirteenth transistor is coupled between the first and second transistors, wherein the fourteenth transistor is coupled between the ninth and tenth transistors, wherein the thirteenth transistor is responsive to a fourth control signal, and wherein the fourteenth transistor is responsive to the third control signal.

In Example 5, the subject matter of Example 4 can optionally further include fifteenth and sixteenth transistors coupled in series, wherein the fifteenth transistor is coupled between the third and fourth transistors, wherein the sixteenth transistor is coupled between the eleventh and twelfth transistors, wherein the fifteenth transistor is responsive to the fourth control signal, and wherein the sixteenth transistor is responsive to the third control signal.

In Example 6, the subject matter of Example 5 can optionally further include a seventeenth transistor coupled between the supply terminal and the thirteenth and fourteenth transistors; and an eighteenth transistor coupled between the ground terminal and the fifteenth and sixteenth transistors.

In Example 7, the subject matter of any one of Examples 1-6 can optionally further include wherein the variable delay circuit is in a delay stage circuit in a ring oscillator circuit.

In Example 8, the subject matter of any one of Examples 1-7 can optionally further include wherein the first, second, fifth, and sixth transistors are p-channel field effect transistors, wherein the third, fourth, seventh, and eighth transistors are n-channel field effect transistors, wherein control inputs of the second and eighth transistors are coupled to receive an inverse of the first control signal, and wherein a control input of the fifth transistor is coupled to receive an inverse of the second control signal.

In Example 9, the subject matter of any one of Examples 1-8 can optionally further include wherein the variable delay circuit inverts an input signal received at the input of the variable delay circuit to generate an inverted output signal at the output of the variable delay circuit.

Example 10 is a method for varying a delay of a signal using a variable delay circuit comprising first, second, third, fourth, fifth, sixth, seventh, and eighth transistors, the method comprising: enabling the second and third transistors in response to a first control signal in a first mode; pulling an output signal to a supply voltage through the first and second transistors and to a ground voltage through the third and fourth transistors in response to an input signal in the first mode; enabling the fifth and seventh transistors in response to a second control signal in a second mode; enabling the sixth and eighth transistors in response to the first control signal in the second mode; disabling the second and third transistors in response to the first control signal in the second mode; and pulling the output signal to the supply voltage through the first, fifth, and sixth transistors and to the ground voltage through the fourth, seventh and eighth transistors in response to the input signal in the second mode.

In Example 11, the subject matter of Example 10 can optionally further include disabling the fifth and seventh transistors in response to the second control signal and the sixth and eighth transistors in response to the first control signal in the first mode.

In Example 12, the subject matter of any one of Examples 10-11 can optionally further include enabling ninth and tenth transistors in response to a third control signal and eleventh and twelfth transistors in response to the second control signal in a third mode; pulling the output signal to the supply voltage through the first, ninth, eleventh, and sixth transistors and to the ground voltage through the fourth, tenth, twelfth, and eighth transistors in response to the input signal in the third mode; and disabling the second and third transistors in response to the first control signal in the third mode.

In Example 13, the subject matter of Example 12 can optionally further include enabling thirteenth and fourteenth transistors in response to a fourth control signal and fifteenth and sixteenth transistors in response to the third control signal in a fourth mode; pulling the output signal to the supply voltage through the first, thirteenth, fifteenth, eleventh, and sixth transistors and to the ground voltage through the fourth, fourteenth, sixteenth, twelfth, and eighth transistors in response to the input signal in the fourth mode; and disabling the second and third transistors in response to the first control signal in the fourth mode.

In Example 14, the subject matter of Example 13 can optionally further include disabling the fifth and seventh transistors in response to the second control signal in the fourth mode; and disabling the ninth and tenth transistors in response to the third control signal in the fourth mode.

In Example 15, the subject matter of Example 13 can optionally further include enabling the fifteenth and sixteenth transistors in response to the third control signal in the second mode.

In Example 16, the subject matter of any one of Examples 10-15 can optionally further include varying a frequency of a ring oscillator circuit comprising the variable delay circuit by varying a logic state of at least one of the first control signal or the second control signal.

In Example 17, the subject matter of any one of Examples 10-16 can optionally further include disabling the sixth and eighth transistors in response to the first control signal in a third mode; enabling the fifth and seventh transistors in response to the second control signal in the third mode; enabling the second and third transistors in response to the first control signal in the third mode; and pulling the output signal to the supply voltage through the first and second transistors and to the ground voltage through the third and fourth transistors in response to the input signal in the third mode.

Example 18 is an oscillator circuit system comprising: delay stage circuits coupled together as a ring oscillator circuit, wherein at least one of the delay stage circuits comprises a variable delay circuit that comprises first, second, third, fourth, fifth, sixth, seventh, and eighth transistors, wherein the first, second, third, and fourth transistors are coupled in series between a supply terminal and a ground terminal, wherein control inputs of the first and fourth transistors are coupled to an input of the variable delay circuit, wherein the second and third transistors are coupled to an output of the variable delay circuit, wherein the fifth and sixth transistors are coupled in series between the first and second transistors and the output, wherein the seventh and eighth transistors are coupled in series between the third and fourth transistors and the output, wherein the second, third, sixth, and eighth transistors are responsive to a first control signal, and wherein the fifth and seventh transistors are responsive to a second control signal.

In Example 19, the subject matter of Example 18 can optionally include wherein the variable delay circuit further comprises: ninth and tenth transistors coupled in series between the first and second transistors and the fifth and sixth transistors, wherein the ninth transistor is responsive to a third control signal, and wherein the tenth transistor is responsive to the second control signal.

In Example 20, the subject matter of Example 19 can optionally include wherein the variable delay circuit further comprises: eleventh and twelfth transistors coupled in series between the third and fourth transistors and the seventh and eighth transistors, wherein the eleventh transistor is responsive to the third control signal, and wherein the twelfth transistor is responsive to the second control signal.

In Example 21, the subject matter of Example 20 can optionally include wherein the variable delay circuit further comprises: thirteenth and fourteenth transistors coupled in series between the first and second transistors and the ninth and tenth transistors, wherein the thirteenth transistor is responsive to a fourth control signal, and wherein the fourteenth transistor is responsive to the third control signal.

In Example 22, the subject matter of Example 21 can optionally include wherein the variable delay circuit further comprises: fifteenth and sixteenth transistors coupled in series between the third and fourth transistors and the eleventh and twelfth transistors, wherein the fifteenth transistor is responsive to the fourth control signal, and wherein the sixteenth transistor is responsive to the third control signal.

Example 23 is a ring oscillator circuit comprising a variable delay circuit, wherein the variable delay circuit comprises: means for pulling an output signal to a supply voltage through first and second transistors and to a ground voltage through third and fourth transistors in response to an input signal to generate a first delay of the variable delay circuit in a first mode, wherein the second and third transistors are enabled in response to a first control signal in the first mode, wherein fifth and seventh transistors are enabled in response to a second control signal and sixth and eighth transistors are enabled in response to the first control signal in a second mode, and wherein the second and third transistors are disabled in response to the first control signal in the second mode; and means for pulling the output signal to the supply voltage through the first, fifth, and sixth transistors and to the ground voltage through the fourth, seventh and eighth transistors in response to the input signal to generate a second delay of the variable delay circuit in the second mode.

In Example 24, the subject matter of Example 23 can optionally include wherein the variable delay circuit further comprises: means for pulling the output signal to the supply voltage through the first, ninth, eleventh, and the sixth transistors and to the ground voltage through the fourth, tenth, twelfth, and the eighth transistors in response to the input signal to generate a third delay of the variable delay circuit in a third mode, wherein the ninth and tenth transistors are enabled in response to a third control signal in the third mode, wherein the eleventh and twelfth transistors are enabled in response to the second control signal in the third mode, and wherein the second and third transistors are disabled in response to the first control signal in the third mode.

In Example 25, the subject matter of Example 24 can optionally include wherein the variable delay circuit further comprises: means for pulling the output signal to the supply voltage through the first, thirteenth, fifteenth, the eleventh, and the sixth transistors and to the ground voltage through the fourth, fourteenth, sixteenth, the twelfth, and the eighth transistors in response to the input signal to generate a fourth delay of the variable delay circuit in a fourth mode, wherein the thirteenth and fourteenth transistors are enabled in response to a fourth control signal and the fifteenth and sixteenth transistors are enabled in response to the third control signal in the fourth mode, and wherein the second and third transistors are disabled in response to the first control signal in the fourth mode.

Example 26 is a variable delay circuit comprising: first pull-up and first pull-down current paths, wherein the variable delay circuit generates first delays in an output signal relative to an input signal in response to the first pull-up and first pull-down current paths being enabled by a first control signal; and second pull-up and second pull-down current paths, wherein the variable delay circuit generates second delays in the output signal relative to the input signal that are different than the first delays in response to the second pull-up and second pull-down current paths being enabled by a second control signal.

In Example 27, the variable delay circuit of Example 26 can optionally further include: third pull-up and third pull-down current paths, wherein the variable delay circuit generates third delays in the output signal relative to the input signal that are different than the first and second delays in response to the third pull-up and third pull-down current paths being enabled by a third control signal.

In Example 28, the variable delay circuit of Example 27 can optionally further include: fourth pull-up and fourth pull-down current paths, wherein the variable delay circuit generates fourth delays in the output signal relative to the input signal that are different than the first, second, and third delays in response to the fourth pull-up and fourth pull-down current paths being enabled by a fourth control signal.

In Example 29, the variable delay circuit of any one of Examples 26-28 can optionally include wherein the first pull-up current path comprises first and second transistors coupled between a supply terminal and an output of the variable delay circuit that generates the output signal, and wherein the first pull-down current path comprises third and fourth transistors coupled between the output and a ground terminal.

In Example 30, the variable delay circuit of Example 29 can optionally include wherein the second pull-up current path comprises fifth and sixth transistors coupled in series, wherein the fifth transistor is coupled between the first and second transistors, wherein the sixth transistor is coupled to the output, wherein the second pull-down current path comprises seventh and eighth transistors coupled in series, wherein the seventh transistor is coupled between the third and fourth transistors, wherein the eighth transistor is coupled to the output, wherein the second, third, sixth, and eighth transistors are responsive to the first control signal, and wherein the fifth and seventh transistors are responsive to the second control signal.

In Example 31, the variable delay circuit of any one of Examples 26-30 can optionally include wherein the variable delay circuit is in a delay stage circuit in a ring oscillator circuit.

In Example 32, the variable delay circuit of any one of Examples 26-31 can optionally include wherein the first pull-up current path comprises first and second transistors, wherein the first pull-down current path comprises third and fourth transistors, wherein the second pull-up current path comprises fifth and sixth transistors, wherein the fifth transistor is coupled between the first and second transistors, wherein the second pull-down current path comprises seventh and eighth transistors, and wherein the seventh transistor is coupled between the third and fourth transistors.

In Example 33, the variable delay circuit of Example 32 can optionally include wherein the third pull-up current path comprises ninth and tenth transistors coupled in series, wherein the ninth transistor is coupled between the first and second transistors, wherein the third pull-down current path comprises eleventh and twelfth transistors coupled in series, and wherein the eleventh transistor is coupled between the third and fourth transistors.

In Example 34, the variable delay circuit of Example 33 can optionally include wherein the fourth pull-up current path comprises thirteenth and fourteenth transistors coupled in series, wherein the thirteenth transistor is coupled between the first and second transistors, wherein the fourteenth transistor is coupled between the ninth and tenth transistors, wherein the fourth pull-down current path comprises fifteenth and sixteenth transistors coupled in series, wherein the fifteenth transistor is coupled between the third and fourth transistors, and wherein the sixteenth transistor is coupled between the eleventh and twelfth transistors.

Example 35 is a method for varying a delay of a signal using a variable delay circuit, the method comprising: generating first delays in an output signal relative to an input signal in response to first pull-up and first pull-down current paths in the variable delay circuit being enabled by a first control signal; and generating second delays in the output signal relative to the input signal that are different than the first delays in response to second pull-up and second pull-down current paths in the variable delay circuit being enabled by a second control signal.

In Example 36, the method of Example 35 can optionally further include generating third delays in the output signal relative to the input signal that are different than the first and second delays in response to third pull-up and third pull-down current paths in the variable delay circuit being enabled by a third control signal.

In Example 37, the method of Example 36 can optionally further include generating fourth delays in the output signal relative to the input signal that are different than the first, second, and third delays in response to fourth pull-up and fourth pull-down current paths in the variable delay circuit being enabled by a fourth control signal.

In Example 38, the method of any one of Examples 35-37 can optionally further include preventing current through the first pull-up and first pull-down current paths in response to the first control signal when the second pull-up and second pull-down current paths are enabled by the second control signal; and preventing current through the second pull-up and second pull-down current paths in response to the first and second control signals when the first pull-up and first pull-down current paths are enabled by the first control signal.

In Example 39, the method of any one of Examples 36-38 can optionally further include preventing current through the first pull-up, first pull-down, second pull-up, and second pull-down current paths in response to the first and second control signals when the third pull-up and third pull-down current paths are enabled by the third control signal.

In Example 40, the method of any one of Examples 36-39 can optionally further include preventing current through the first pull-up, first pull-down, third pull-up, and third pull-down current paths in response to the first, second, and third control signals when the second pull-up and second pull-down current paths are enabled by the second control signal.

In Example 41, the method of any one of Examples 35-40 can optionally further include generating third delays in the output signal relative to the input signal that are different than the first and second delays by changing capacitances of the first pull-up and first pull-down current paths in response to the second control signal.

In Example 42, the method of any one of Examples 35-41 can optionally further include varying a frequency of a signal generated by a ring oscillator circuit comprising the variable delay circuit by varying a logic state of at least one of the first control signal or the second control signal.

The foregoing description of the exemplary embodiments of the present invention has been presented for the purpose of illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A variable delay circuit comprising:
   first pull-up and first pull-down current paths; and
   second pull-up and second pull-down current paths, wherein the variable delay circuit generates first delays in an output signal relative to an input signal in response to the first pull-up and first pull-down current paths being enabled by a first control signal and in response to the second pull-up and second pull-down current paths being disabled by a second control signal, and
   wherein the variable delay circuit generates second delays in the output signal relative to the input signal that are different than the first delays in response to the second pull-up and second pull-down current paths being enabled by the second control signal and in response to the first pull-up and first pull-down current paths being disabled by the first control signal.

2. The variable delay circuit of claim 1 further comprising:
   third pull-up and third pull-down current paths, wherein the variable delay circuit generates third delays in the output signal relative to the input signal that are different than the first and second delays in response to the third pull-up and third pull-down current paths being enabled by a third control signal.

3. The variable delay circuit of claim 2 further comprising:
   fourth pull-up and fourth pull-down current paths, wherein the variable delay circuit generates fourth delays in the output signal relative to the input signal that are different than the first, second, and third delays in response to the fourth pull-up and fourth pull-down current paths being enabled by a fourth control signal.

4. The variable delay circuit of claim 1, wherein the first pull-up current path comprises first and second transistors coupled between a supply terminal and an output of the variable delay circuit that generates the output signal, and wherein the first pull-down current path comprises third and fourth transistors coupled between the output and a ground terminal.

5. The variable delay circuit of claim 4, wherein the second pull-up current path comprises fifth and sixth transistors coupled in series, wherein the fifth transistor is coupled between the first and second transistors, wherein the sixth transistor is coupled to the output,
   wherein the second pull-down current path comprises seventh and eighth transistors coupled in series, wherein the seventh transistor is coupled between the third and fourth transistors, wherein the eighth transistor is coupled to the output, wherein the second, third, sixth, and eighth transistors are responsive to the first control signal, and wherein the fifth and seventh transistors are responsive to the second control signal.

6. The variable delay circuit of claim 1, wherein the variable delay circuit is in a delay stage circuit in a ring oscillator circuit.

7. The variable delay circuit of claim 3, wherein the first pull-up current path comprises first and second transistors, wherein the first pull-down current path comprises third and fourth transistors, wherein the second pull-up current path comprises fifth and sixth transistors, wherein the fifth transistor is coupled between the first and second transistors, wherein the second pull-down current path comprises seventh and eighth transistors, and wherein the seventh transistor is coupled between the third and fourth transistors.

8. The variable delay circuit of claim 7, wherein the third pull-up current path comprises ninth and tenth transistors coupled in series, wherein the ninth transistor is coupled between the first and second transistors, wherein the third pull-down current path comprises eleventh and twelfth transistors coupled in series, and wherein the eleventh transistor is coupled between the third and fourth transistors.

9. The variable delay circuit of claim 8, wherein the fourth pull-up current path comprises thirteenth and fourteenth transistors coupled in series, wherein the thirteenth transistor is coupled between the first and second transistors, wherein the fourteenth transistor is coupled between the ninth and tenth transistors, wherein the fourth pull-down current path comprises fifteenth and sixteenth transistors coupled in series, wherein the fifteenth transistor is coupled between the third and fourth transistors, and wherein the sixteenth transistor is coupled between the eleventh and twelfth transistors.

10. A method for varying a delay of a signal using a variable delay circuit, the method comprising:
    generating first delays in an output signal relative to an input signal in response to first pull-up and first pull-down current paths in the variable delay circuit being enabled by a first control signal;
    generating second delays in the output signal relative to the input signal that are different than the first delays in response to second pull-up and second pull-down current paths in the variable delay circuit being enabled by a second control signal; and
    varying a frequency of a signal generated by a ring oscillator circuit comprising the variable delay circuit by varying a logic state of at least one of the first control signal or the second control signal.

11. The method of claim 10 further comprising:
    generating third delays in the output signal relative to the input signal that are different than the first and second delays in response to third pull-up and third pull-down current paths in the variable delay circuit being enabled by a third control signal.

12. The method of claim 11 further comprising:
generating fourth delays in the output signal relative to the input signal that are different than the first, second, and third delays in response to fourth pull-up and fourth pull-down current paths in the variable delay circuit being enabled by a fourth control signal.

13. The method of claim 11 further comprising:
preventing current through the first pull-up and first pull-down current paths in response to the first control signal when the second pull-up and second pull-down current paths are enabled by the second control signal; and
preventing current through the second pull-up and second pull-down current paths in response to the first and second control signals when the first pull-up and first pull-down current paths are enabled by the first control signal.

14. The method of claim 13 further comprising:
preventing current through the first pull-up, first pull-down, second pull-up, and second pull-down current paths in response to the first and second control signals when the third pull-up and third pull-down current paths are enabled by the third control signal.

15. The method of claim 11 further comprising:
preventing current through the first pull-up, first pull-down, third pull-up, and third pull-down current paths in response to the first, second, and third control signals when the second pull-up and second pull-down current paths are enabled by the second control signal.

16. The method of claim 10 further comprising:
generating third delays in the output signal relative to the input signal that are different than the first and second delays by changing capacitances of the first pull-up and first pull-down current paths in response to the second control signal.

17. The method of claim 10 further comprising:
disabling the first pull-up and first pull-down current paths in response to the first control signal when the second pull-up and second pull-down current paths are enabled by the second control signal; and
disabling the second pull-up and second pull-down current paths in response to the second control signal when the first pull-up and first pull-down current paths are enabled by the first control signal.

18. An oscillator circuit system comprising:
delay stage circuits coupled together as a ring oscillator circuit, wherein at least one of the delay stage circuits comprises a variable delay circuit that comprises first, second, third, fourth, fifth, sixth, seventh, and eighth transistors,
wherein the first, second, third, and fourth transistors are coupled in series between a supply terminal and a ground terminal, wherein control inputs of the first and fourth transistors are coupled to an input of the variable delay circuit, wherein the second and third transistors are coupled to an output of the variable delay circuit,
wherein the fifth and sixth transistors are coupled in series between the first and second transistors and the output,
wherein the seventh and eighth transistors are coupled in series between the third and fourth transistors and the output, wherein the second, third, sixth, and eighth transistors are responsive to a first control signal, and wherein the fifth and seventh transistors are responsive to a second control signal.

19. The oscillator circuit system of claim 18, wherein the variable delay circuit further comprises:
ninth and tenth transistors coupled in series between the first and second transistors and the fifth and sixth transistors, wherein the ninth transistor is responsive to a third control signal, and wherein the tenth transistor is responsive to the second control signal.

20. The oscillator circuit system of claim 19, wherein the variable delay circuit further comprises:
eleventh and twelfth transistors coupled in series between the third and fourth transistors and the seventh and eighth transistors, wherein the eleventh transistor is responsive to the third control signal, and wherein the twelfth transistor is responsive to the second control signal.

* * * * *